(12) United States Patent
Lojek

(10) Patent No.: US 7,057,235 B2
(45) Date of Patent: Jun. 6, 2006

(54) MIRROR IMAGE MEMORY CELL TRANSISTOR PAIRS FEATURING POLY FLOATING SPACERS

(75) Inventor: Bohumil Lojek, Colorado Springs, CO (US)

(73) Assignee: Atmel Corporation, San Jose, CA (US)

( * ) Notice: Subject to any disclaimer, the term of this patent is extended or adjusted under 35 U.S.C. 154(b) by 0 days.

(21) Appl. No.: 10/955,453

(22) Filed: Sep. 29, 2004

(65) Prior Publication Data

US 2005/0056882 A1    Mar. 17, 2005

Related U.S. Application Data (62) Division of application No. 10/423,637, filed on Apr. 25, 2003, now Pat. No. 6,919,242.

(51) Int. Cl.
*H01L 29/788* (2006.01)
*H01L 29/792* (2006.01)

(52) U.S. Cl. .................. 257/326; 257/321; 257/331
(58) Field of Classification Search ............. 257/66, 257/315, 321, 326, 331
See application file for complete search history.

(56) References Cited

U.S. PATENT DOCUMENTS

| | | | |
|---|---|---|---|
| 4,814,594 A | 3/1989 | Drexler | 235/487 |
| 4,931,847 A | 6/1990 | Corda | 357/23.5 |
| 5,108,939 A | 4/1992 | Manley et al. | 437/43 |
| 5,406,521 A | 4/1995 | Hara | 365/218 |
| 5,487,034 A | 1/1996 | Inoue | 365/185.18 |
| 5,761,126 A | 6/1998 | Chi et al. | 365/185.27 |
| 5,808,338 A | 9/1998 | Gotou | 257/315 |
| 5,999,456 A | 12/1999 | Sali et al. | 365/185.28 |
| 6,043,530 A | 3/2000 | Chang | 257/320 |
| 6,160,287 A | 12/2000 | Chang | 257/321 |
| 6,240,021 B1 | 5/2001 | Mori | 365/185.27 |
| 6,323,088 B1 | 11/2001 | Gonzalez | 438/257 |
| 6,343,031 B1 | 1/2002 | Murata | 365/104 |
| 6,385,689 B1 * | 5/2002 | Cummins et al. | 711/103 |
| 6,468,863 B1 | 10/2002 | Hsieh et al. | 438/261 |
| 6,479,351 B1 | 11/2002 | Lojek et al. | 438/266 |
| 6,486,032 B1 | 11/2002 | Lin et al. | 438/266 |
| 6,541,816 B1 | 4/2003 | Ramsbey et al. | 257/324 |
| 6,563,733 B1 | 5/2003 | Chang et al. | 365/185.1 |
| 6,580,116 B1 | 6/2003 | Ogura | 257/314 |
| 6,597,047 B1 | 7/2003 | Arai et al. | 257/411 |
| 2003/0199143 A1 | 10/2003 | Lin et al. | 438/262 |

FOREIGN PATENT DOCUMENTS

| EP | 11186415 | 12/1997 |
|---|---|---|
| JP | 11154712 | 6/1999 |

* cited by examiner

Primary Examiner—Zandra V Smith
Assistant Examiner—Pamela E Perkins
(74) Attorney, Agent, or Firm—Schneck & Schneck; Thomas Schneck (57) ABSTRACT

By arranging floating spacer and gate non-volatile memory transistors in symmetric pairs, increased chip density may be attained. For each pair of such transistors, the floating gates are laterally aligned with floating spacers appearing on laterally outward edges of each floating gate. At laterally inward edges, the two transistors share a common drain electrode. The transistors are independent of each other except for the shared drain electrode. Tunnel oxide separated the floating spacer from the floating gate, but both the spacer and the gate are maintained at a common potential, thereby providing dual paths for charge exiting the tunnel oxide, as the charged is propelled by a programming voltage. The pairs of transistors can be aligned in columns with the direction of the columns orthogonal to the direction of the pairs, thereby forming a memory array.

9 Claims, 12 Drawing Sheets

Fig_5

Fig_6

Fig_9

Fig_10

Fig_15

Fig_19

Fig_20

Fig_21

MIRROR IMAGE MEMORY CELL TRANSISTOR PAIRS FEATURING POLY FLOATING SPACERS

CROSS-REFERENCE TO RELATED APPLICATION

This is a divisional of application Ser. No. 10/423,637 filed Apr. 25, 2003 now U.S. Pat. No. 6,919,242.

TECHNICAL FIELD

The invention relates to non-volatile memory cell transistors and, in particular, to a compact arrangement of such memory cells in a memory array and a method of making them.

BACKGROUND ART

In U.S. Pat. No. 6,479,351 to Lojek et al., incorporated by reference herein, there is disclosed a self-aligned non-volatile memory cell comprising a small sidewall spacer electrically coupled and being located next to a main floating gate region. Both the small sidewall spacer and the main floating gate region are formed from conductive polysilicon on a substrate and both form the floating gate of the non-volatile memory cell. Both are isolated electrically from the substrate by an oxide layer which is thinner between the small sidewall spacer and the substrate and is thicker between the main floating gate region and the substrate. The thin oxide region is thin enough to be an electron tunneling medium, i.e. a pathway for electrons to tunnel into the floating gate from a substrate electrode. The thin oxide layer is brought up vertically along a wall of the main floating gate region, separating the main floating gate region from the spacer, allowing charge entering the thin oxide to migrate out in opposite directions, i.e. into the main floating gate body or into the sidewall spacer. Both the main floating gate body and the sidewall spacer are made of polysilicon and are electrically connected so that both have the same electrical potential. A control gate overlying the main floating gate body and the sidewall spacer can draw charge from the substrate into these structures by application of a programming voltage where the charge will remain until an opposite programming voltage causes discharge of the structures.

Japanese Patent Publication No. 11154712 by K. Kenichi of NEC Corp. shows a similar structure.

While the spacer floating gate memory cells disclosed in the '351 patent are very useful, an object of the invention was to devise a way to make spacer floating gate memory cells more compact for use in large scale memory arrays.

SUMMARY OF INVENTION

The above object has been met by constructing a symmetric side-by-side arrangement of memory cells of the type described in the '351 patent, with the two devices sharing a common subsurface electrode that defines a plane of symmetry. In this manner, a plurality of two side-by-side columns of memory cells on a wafer can be simultaneously fabricated.

In one embodiment, consider individual pairs of devices, one device is to the left and one device is to the right of a common central substrate doped region that forms a common electrode for the pair. Each device has at least one sidewall spacer facing an electrically insulated central polysilicon body, i.e. a poly floating gate, with left and right edges that are used for self-aligned placement of subsurface source and drain electrodes, including the previously mentioned common electrode, prior to the sidewall spacer formation. The left device has a floating polysilicon spacer separated from the central polysilicon body on the left edge by tunnel oxide and the right device has a floating polysilicon spacer separated from the associated central polysilicon body on the right edge by tunnel oxide. Each memory device has a substrate doped region outwardly adjacent to each polysilicon spacer. Each central polysilicon body is electrically connected to the facing polysilicon spacer, allowing charge entering the tunnel oxide separating the two regions to escape by tunneling into either region. The electrical connection between the two regions equalizes the electrical potential of the two regions. The two memory cells are capable of independently storing two binary bits of data in the form of charge transferred to and from the floating polysilicon spacers and the central polysilicon body under the influence of a control electrode either storing charge upon, or discharging, a polysilicon spacer and an associated facing polysilicon body.

In another embodiment, a single polysilicon body on a silicon substrate with sub-surface electrodes of the same kind on opposed lateral sides of the body. The body is covered with tunnel oxide and then a pair of polysilicon spacers are formed on opposite edges of the body. The entire structure is protected in a manner such that the single polysilicon body is divided into two independent floating gates by etching the single polysilicon body to the substrate. The two floating gate structures are finished by adding a control electrode, as before.

BRIEF DESCRIPTION OF THE DRAWINGS

FIG. 18 is a top view of a plurality of pairs of side-by-side floating gate memory cell devices of the kind shown in FIG.

1 showing multiple polysilicon structures with the geometry of the device shown in FIGS. 16 and 17.

BEST MODE FOR CARRYING OUT THE INVENTION

Figure 1:
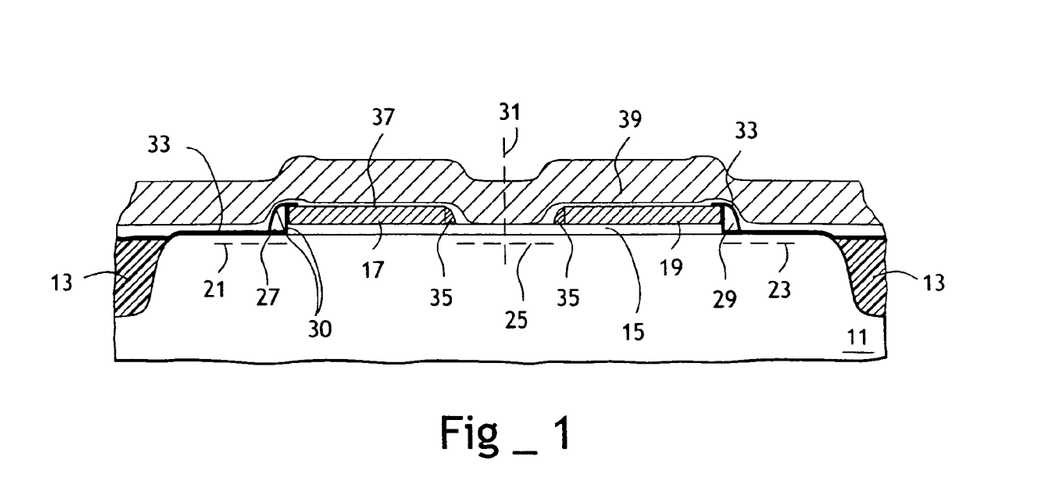
FIG. 1 is a side cutaway view of a pair of side-by-side floating gate memory cell devices fabricated in a common substrate in accordance with the present invention.

With reference to FIG. 1, a p-type substrate 11 has deep n-well isolation regions 13 as typically used in LOCOS or STI oxidation of silicon. The isolation regions define the active area for memory cell fabrication. Above the substrate is gate oxide layer 15 and polysilicon floating gate members, including left member 17 and right member 19 above the gate oxide layer 15. Each floating gate member has vertical sidewalls at both laterally inward edges, which are very close to each other, i.e. within a few microns, and at laterally outward edges, allowing for self-aligned implantation of n-type doped regions in substrate 11 forming subsurface electrodes, namely left source 21, right source 23, and shared drain 25. The vertical center line 31 through drain 25 forms a left and right plane of symmetry for the two memory cell transistors.

Left and right polysilicon spacers, 27 and 29 respectively, are floating structures, spaced laterally outwardly from the plane of symmetry, insulated from the floating gates 17 and 19 by a layer of thin oxide, known as tunnel oxide 30, having a thickness ranging between 10 and 50 angstroms. A layer 33 of low temperature oxide, known as LTO, protects the outer and upper surface of the left and right poly spacers 27 and 29. Laterally surrounding the floating gates 17 and 19 is contacting poly member 35, only visible on the inward sides of the floating gates, but surrounding the floating gates on three sides and wrapping or joining the sides of the poly spacers 27 and 29. Because the contacting poly member is conductive, the respective poly spacers and the floating gates are at the same electrical potential.

Above the low temperature oxide (LTO) layer 33 and the poly gates 17 and 19 is an oxide-nitride-oxide (ONO) layer 37. Above the ONO layer 37 is a control poly layer 39 having a thickness comparable to the floating gates 17 and 19.

In operation, programming signals having a sufficiently high voltage cause electric charge from one of the sources 21 or 23 to tunnel into the floating poly members, poly spacers 27 or 29, as well as the neighboring poly floating gates 17 and 19 respectively for a charge storage operation. Charge tunnels through tunnel oxide 30 from a substrate electrode and has an opportunity to emerge from the tunnel oxide into two contacting surfaces, namely left poly spacer 27 or the left poly floating gate 17. It does not make any difference whether the charge goes mainly into one or the other of the two poly members because they are joined by contacting poly member 35 which equalizes the electrical potential among the two poly members. The increased surface area in contact with the thin oxide means that charge can more readily leave the tunnel oxide through the two poly opposed surfaces. Charge storage and removal from the floating members becomes faster due to lowered capacitance. Discharge of the floating members is equally fast under the influence of the control poly layer 39. The layering of each transistor is similar to what is disclosed in U.S. Pat. No. 6,479,351 assigned to the assignee of the present invention. What is new is the simultaneous symmetric construction of pairs of devices with a shared electrode structure.

Figure 2:
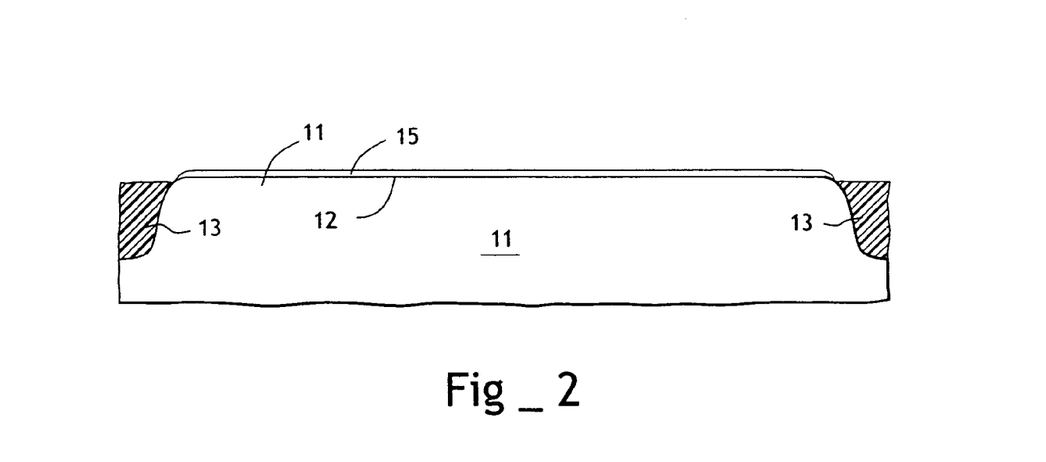
FIGS. 2–5 are side cutaway views of early steps in manufacturing the devices shown in FIG. 1.
Figure 3:
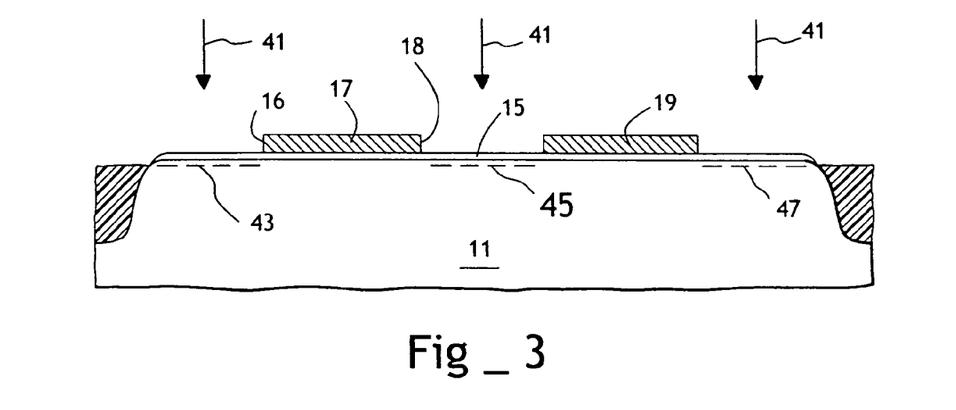

With reference to FIG. 2, p-type substrate 11 is seen to have a planar surface 12 which is the upper surface of the substrate. Upon the planar surface 12, a layer of thermal oxide is grown, known as gate oxide 15. This oxide layer has a uniform thickness of approximately 100–300 angstroms (Å) across the planar surface 12. Over the gate oxide layer 15, a polysilicon layer, known as poly I, is deposited, approximately 1500 Å thick. By a process of masking and etching, a pair of side-by-side polysilicon mesas are formed, as shown in FIG. 3. One mesa is termed poly floating gate 17, while the other is termed poly floating gate 19. The floating gates each have a left edge and a right edge, such as left edge 16 and right edge 18. In the top view, as in FIG. 7, the two floating gates are laterally aligned in their side-by-side relation, like a bifurcated stripe. Returning to FIG. 3, the left and right edges are made generally vertical in the masking and etching process. The vertical edges allow for ion implantation into substrate 11, indicated by arrows 41. The ion implantation consists of the injection of energetic ions, such as arsenic or phosphorus ions, into substrate 11 to form subsurface doped n+ self-aligned regions. The left subsurface implanted region is source 43. The central implanted region is drain 45. Source 43 and drain 45 are associated with a memory cell to be formed using poly floating gate 17. A third subsurface implanted region is source 47 which is paired with drain 45 and the poly floating gate 19 for forming a second memory cell transistor. Region 45 serves as a shared electrode for both memory cell transistors. On the other hand, each transistor has its own drain electrode and, except for the shared source, each memory cell transistor is separate and independent.

Figure 4:
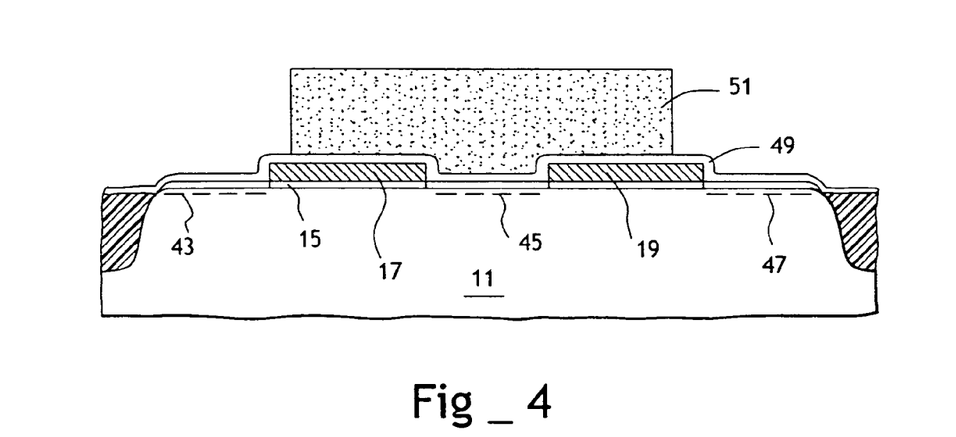

Once the subsurface source and drain electrodes are formed, a layer 49 of oxide, shown in FIG. 4, deposited by chemical vapor deposition (CVD), is a layer approximately 50–100 Å thick over the surface of the elements seen in FIG. 3. A region over the CVD oxide layer 49 is protected or masked with a resist mask 51. The zone of protection includes the source electrode 45 extending laterally outwardly covering about two-thirds of the poly floating gates 17 and 19. The thickness of the resist mask 51 is not critical, sufficient to protect underlying oxide for a subsequent wet oxide etch, shown in FIG. 5.

Figure 5:
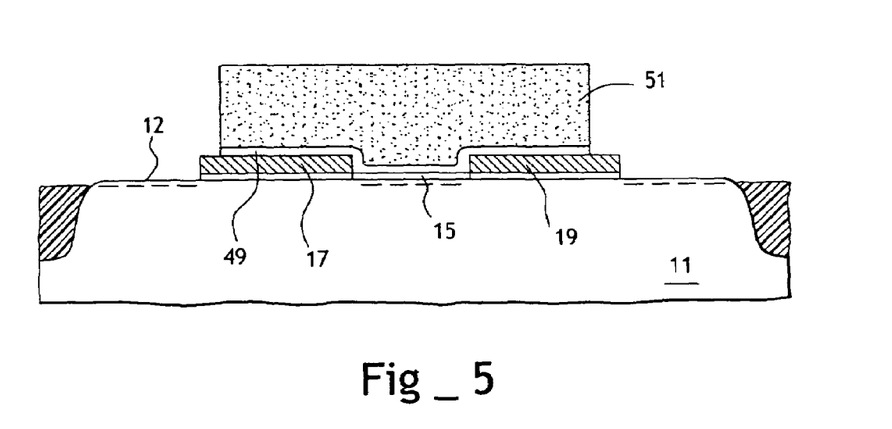

In FIG. 5, the resist mask 51 protects the CVD oxide layer 49 immediately beneath the mask, as well as portions of the poly floating gates 17 and 19 and the gate oxide layer 15 which lies beneath the poly floating gates 17 and 19. Note that oxide has been stripped on the left and right sides of poly floating gates 17 and 19, as well as over a portion of the top of the poly floating gates 17 and 19. The exposed planar surface 12 of substrate 11 is being prepared for application of a very thin layer of oxide known as tunnel oxide.

Figure 6:
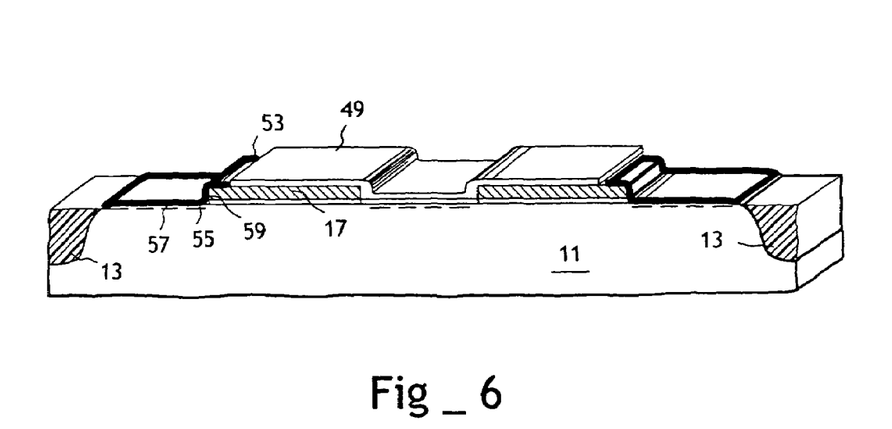
FIG. 6 is a perspective view of a step in manufacturing the devices of FIG. 1 involving deposition of thin oxide, known as tunnel oxide.

In FIG. 6, tunnel oxide layer 30 is applied across the entirety of the structure between the isolation regions 13. After the resist layer is removed, the tunnel oxide may be seen to reside in a first portion 53 which abuts a lateral edge of CVD oxide layer 49. The tunnel oxide further has a second vertical portion 55 which is unitary with the first portion 53, but covers a lateral edge 59 of poly floating gate 17. The second portion 55 is joined to a third portion 57 which is made at the same time as the other portions and has the same thickness as these portions, i.e. 30–70 Å. The tunnel oxide will then be seen to extend from isolation region 15 to the first tunnel oxide portion 53.

Figure 7:
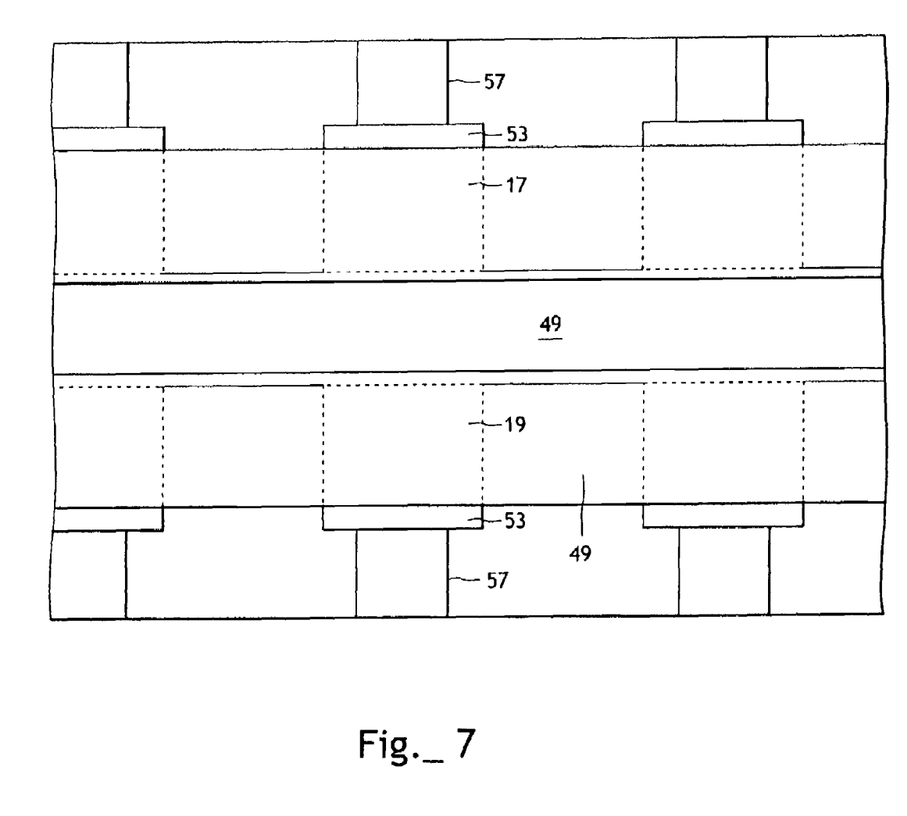
FIG. 7 is a top view of a plurality of pairs of side-by-side floating gate memory cell devices showing deposition of thin oxide as in FIG. 6.
Figure 8:
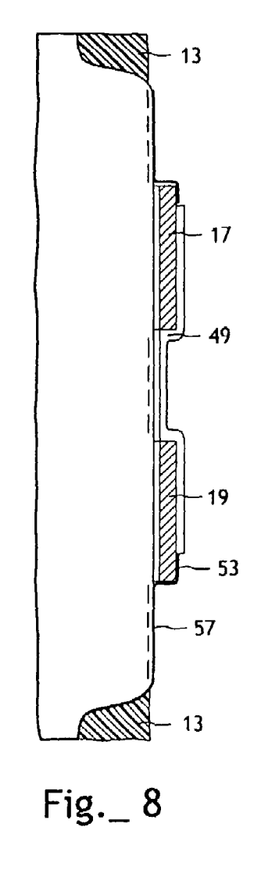
FIG. 8 is a side view of the memory cell devices shown in FIG. 7.

In FIGS. 7 and 8, the third portion of the tunnel oxide 57 will be seen extending from isolation regions 13 to abut with CVD oxide layer 49, atop of the poly floating gate 17. The CVD oxide layer 49 is seen to separate the poly floating gates 17 and 19.

Figure 9:
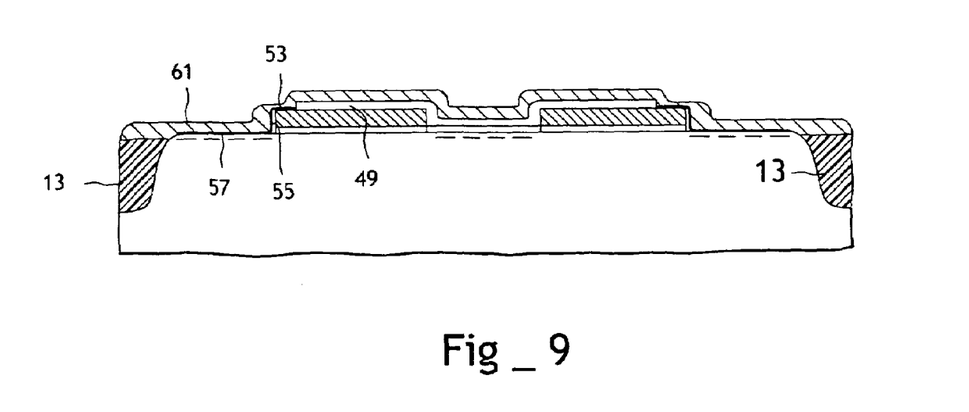
FIGS. 9–11 are side cutaway views of intermediate steps in manufacturing the devices shown in FIG. 1.
Figure 10:
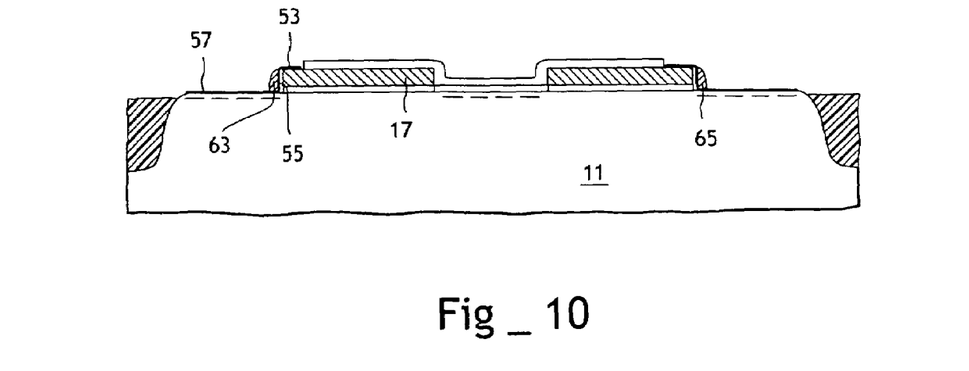

In FIG. 9, a second polysilicon layer 61 is deposited over the entirety of the surface of the structure, including first, second, and third portions of the tunnel oxide 53, 55 and 57, respectively, as well as the CVD oxide layer 49 and even over the isolation regions 13. This polysilicon layer is then etched to the point where all of the polysilicon is removed, except for spacers 63 and 65, seen in FIG. 10, which are small polysilicon regions abutting, on the left side, the second portion 55 of the tunnel oxide and a corresponding tunnel oxide portion on the right side. The spacers 63 and 65 are small slivers of polysilicon which remain hidden during the dry etch, with the etch being terminated before the slivers are removed. Note that the poly spacers are floating structures, being isolated from substrate 11 by the third portion of the tunnel oxide and being isolated from poly floating gates by the second portion of the tunnel oxide 55 and the first portion of tunnel oxide 53.

Figure 11:
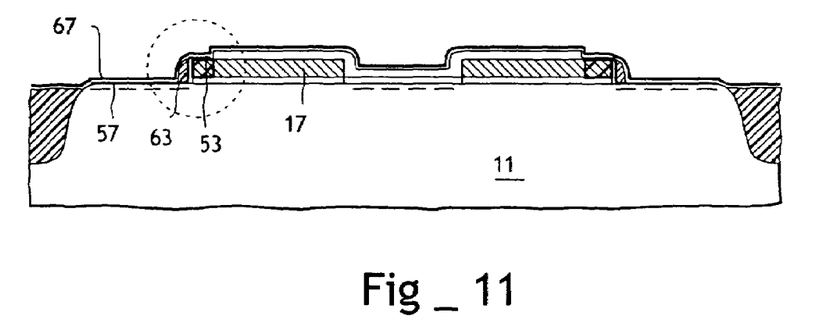

Next, as seen in FIG. 11, a layer of low temperature oxide (LTO) 67 is applied over the third portion of the tunnel oxide 57, the left poly spacer 63, and the first tunnel oxide portion 53. While only the left memory cell is discussed, corresponding construction is occurring in the symmetric right memory cell. In the top view of FIG. 12, the left poly spacer 63 is seen to be U-shaped, having lateral wings 71 and 73 contacting a central wing 75. The lateral wings 71 and 73 are seen to extend to the CVD oxide layer 49. The U-shaped poly spacer 27 is insulated from the poly floating gate 17 by the tunnel oxide portions, principally the upright second portion 55, but peripherally surrounds and contacts both floating gate 17 and poly spacer 63.

Figure 13:
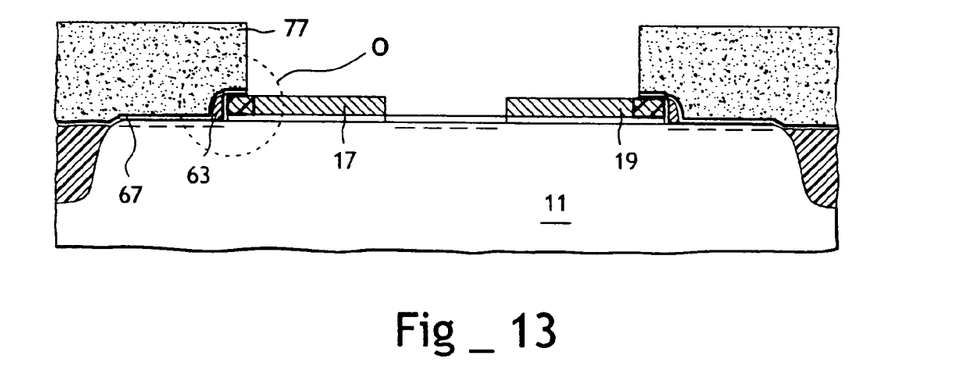
FIG. 13 is a side cutaway view of a late stage step in manufacturing the devices shown in FIG. 1.

In FIG. 13, a mask 77 is seen to be applied to protect the LTO oxide layer 67. Other oxide regions are etched from atop of the poly floating gates 17 and 19, as well as in the zone between the two polysilicon gates. The circle, 0, in FIG. 13 is a detail shown more clearly in FIG. 14.

Figure 12:
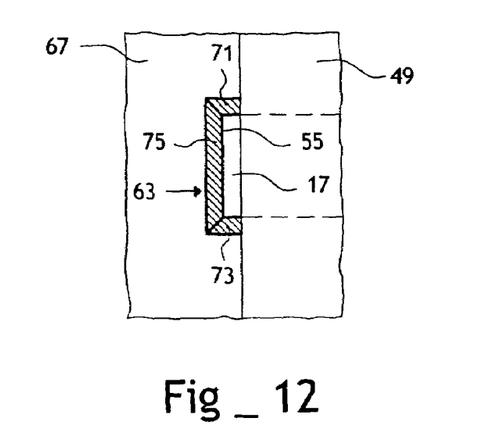
FIG. 12 is a top view of a portion of the structure illustrated in FIG. 11, the portion being marked by a circle in FIG. 11.
Figure 14:
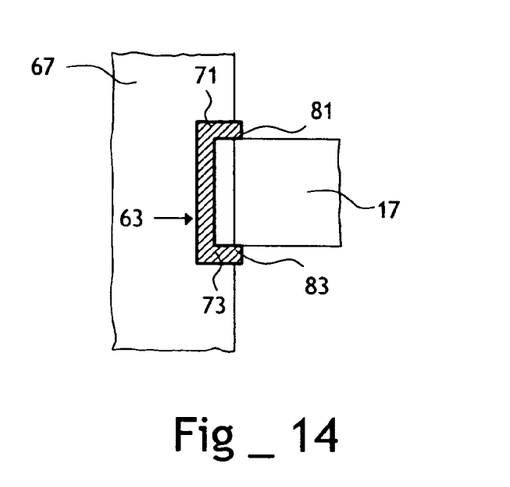
FIG. 14 is a top view of a portion of the structure illustrated in FIG. 13, the portion being marked by a circle in FIG. 13.
Figure 15:
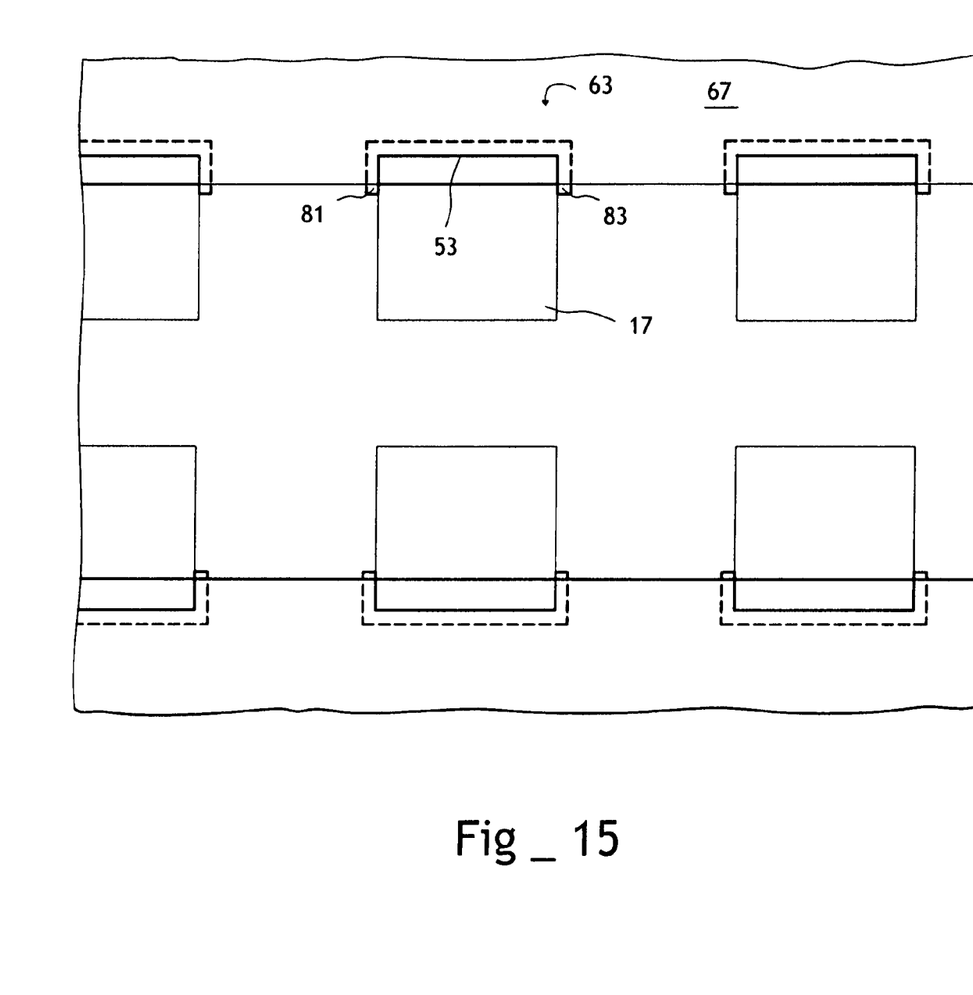
FIG. 15 is a top view of a plurality of pairs of side-by-side floating gate memory cell devices showing multiple polysilicon structures with the geometry of the device shown in FIG. 14.

FIGS. 14 and 15 show the device with the mask of FIG. 13 removed. FIG. 14 appears much like FIG. 12, except that the CVD oxide layer 49 of FIG. 12 is seen to be removed and the LTO oxide layer 67 has been trimmed back, leaving portions of lateral wings 71 and 73 exposed at the tips 81 and 83, respectively. It is important that these exposed tips make contact with the floating poly gate 17 in a subsequent step.

FIG. 15 shows how the tips 81 and 83 abut the sides of the floating poly gate 17. Poly spacer 63 is shown in dash lines because it is covered by LTO oxide layer 67. The solid rectangular line 53 represents the first portion of the tunnel oxide below the poly spacer 63.

Figure 16:
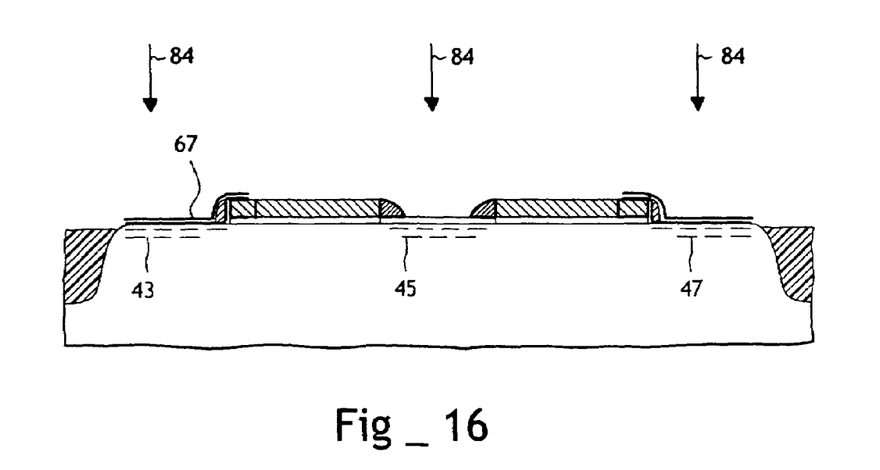
FIG. 16 is a side cutaway view of another late stage step in manufacturing the devices shown in FIG. 1.

In FIG. 16, there is an ion implantation represented by arrows 84, increasing the subsurface doping in source regions 43 and 47 and drain region 45. Doping of the source regions must be sufficient such that electrons can be pulled from the source regions through the tunnel oxide into the floating gate region. Note that implantation goes through the LTO oxide layer 67. Once implantation is complete, a layer of contacting poly 85 is deposited so that the exposed tips 81 and 83 of the left poly spacer 63, seen in FIG. 17, can make contact with the floating poly gate 17. Thus, the floating spacer 63 and the floating poly gate 17 are electrically united by the contacting poly 85. Charge which is pulled from source 43 by a programming voltage applied to the control gate moves into the tunnel oxide between the left poly spacer 63 and the left poly floating gate 17 by tunneling action. Charge tunneling through the tunnel oxide has an opportunity to tunnel into either the poly floating gates 17 or the poly floating spacer 63. In either case, charge is distributed in the polysilicon through the contacting poly layer 85 so that the poly spacer 63 and the poly floating gate 17 are at the same electrical potential.

Figure 18:
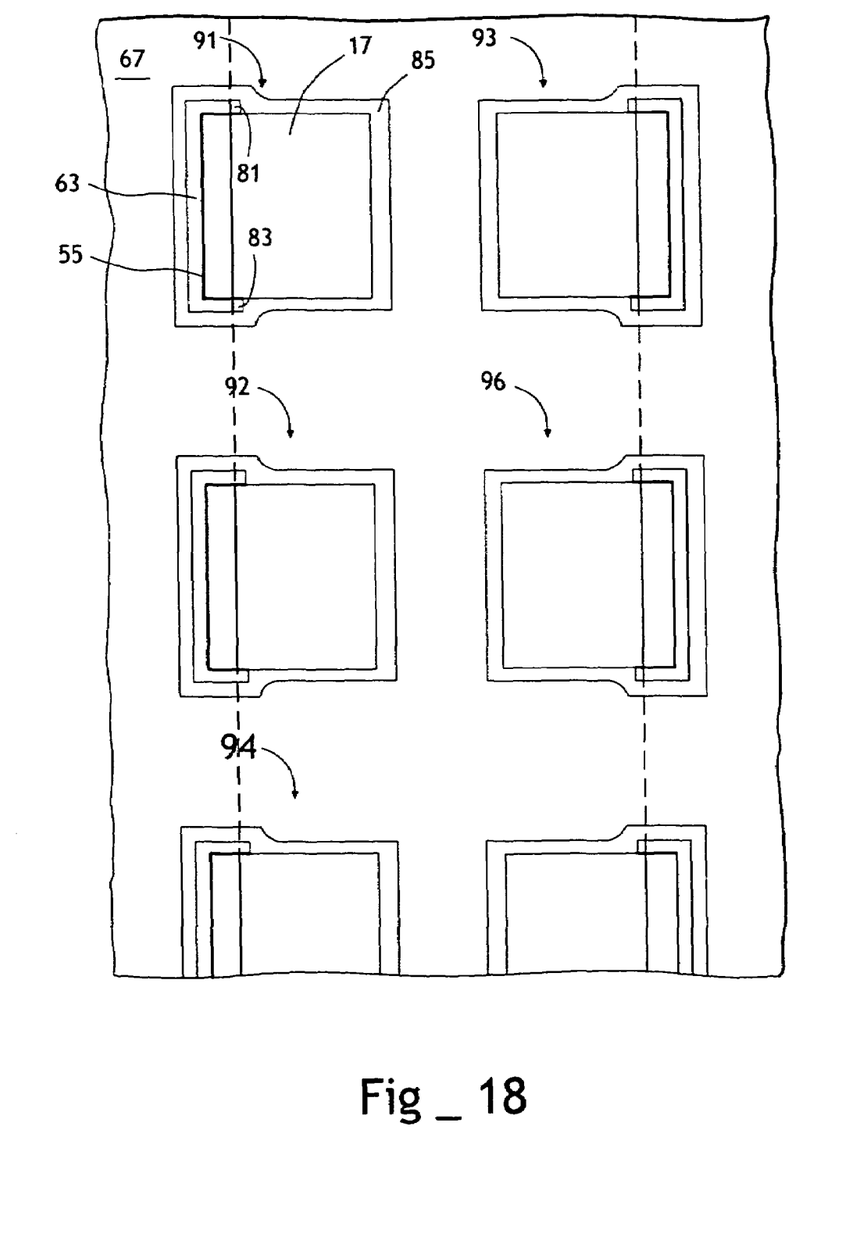

In a top view of FIG. 18, a pair of side-by-side floating gate memory cell devices are seen, just prior to application of a final oxide coating and deposition of a control poly upper layer, shown in FIG. 1. In FIG. 18, the left memory cell device 91 is symmetric with the right memory cell device 91. Similarly, left devices 92 and 94 are symmetrically opposite to right memory cell devices 96 and 98, respectively. The right memory cell devices are mirror images of the left memory cell devices and so only the left memory cell device 91 will be described. The left memory cell device is seen to have poly floating gate 17 surrounded by contacting poly 85. The U-shaped spacer 63 is electrically joined to the poly floating gate 17 at tips 81, 83. The poly floating spacer 63 is separated from the floating poly gate 17 by a tunnel oxide layer. The second portion 55 is a vertical section on the left edge of the floating poly spacer.

The left and right memory cells will operate independently, storing two binary bits of data in the form of charge transferred from the substrate to the combination of the poly floating gate and poly spacer of each memory cell device. After a layer of ONO insulator is applied atop the memory cell devices, a layer of control poly is situated and then cut into a pair of stripes, with one stripe overlying memory cell devices 91, 92 and 94 and a second parallel polysilicon stripe overlying memory cell devices 93, 96 and 98. Programming voltages are applied to the control gate such that charge will be pulled from a source, through the tunnel oxide into the floating structure formed by electrical contact between the poly floating gate 17 and the poly spacer 63. An opposite voltage applied to the control gate drives charge from the floating structure back into the source electrode in the silicon substrate.

In the construction of FIG. 18, adjacent memory cell devices may be very closely spaced and due to the symmetry of the devices, two separate and distinct memory cell devices can be manufactured in a space between isolation regions not much largely than a single memory cell manufactured between similar isolation regions. Adjacent pairs of devices may be longitudinally aligned to make a rectangular array of devices.

In the embodiment described above, a pair of polysilicon mesas, arranged side-by-side, was formed at an early stage in the manufacturing process, as shown in FIG. 3. These mesas became portions of floating gate structures of two memory transistors. However, it is possible to vary the process and form the side-by-side polysilicon floating gate structures at a late or intermediate stage of processing, as described below, as an alternate embodiment.

Figure 19:
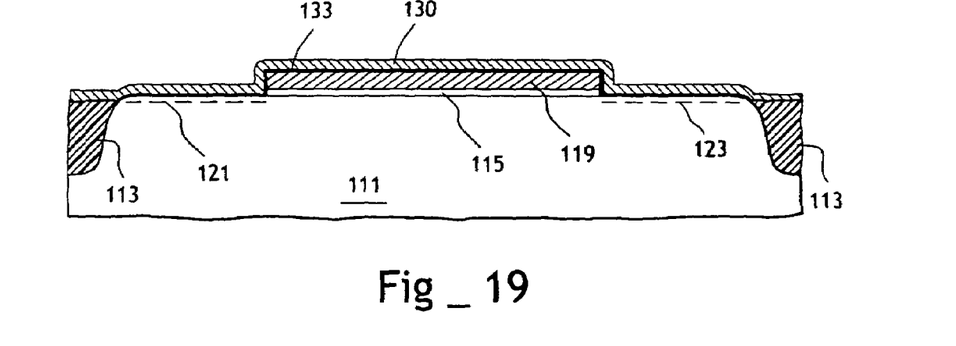
FIGS. 19–22 are side cutaway views of an alternate manufacturing method for the devices shown in FIG. 1.

In FIG. 19, substrate 111 has a gate oxide layer 115 covered by a polysilicon partial layer 119 in a single body where an active region is defined between isolation areas 113. The polysilicon layer 119, formed by masking and etching a larger layer than might extend over most of a chip or mask. The single polysilicon body 119 serves as part of an alignment mask for implants 121 and 123, corresponding to implants 21 and 23 of FIG. 1, forming subsurface electrodes, such as sources, for a pair of future MOS memory transistors. The single body 119 will be divided at a later stage and so the implants 121 and 123 can form the same type of electrode at opposite ends of poly layer 119. Another electrode, namely a drain is formed where the body is divided.

A thin layer of tunnel oxide 133 having very slight thickness is disposed over the polysilicon layer 119 and substrates 121 and 123. The oxide thickness is the same as previously specified for tunnel oxide. A second poly layer 130 is disposed directly over the tunnel oxide layer 133.

Figure 20:
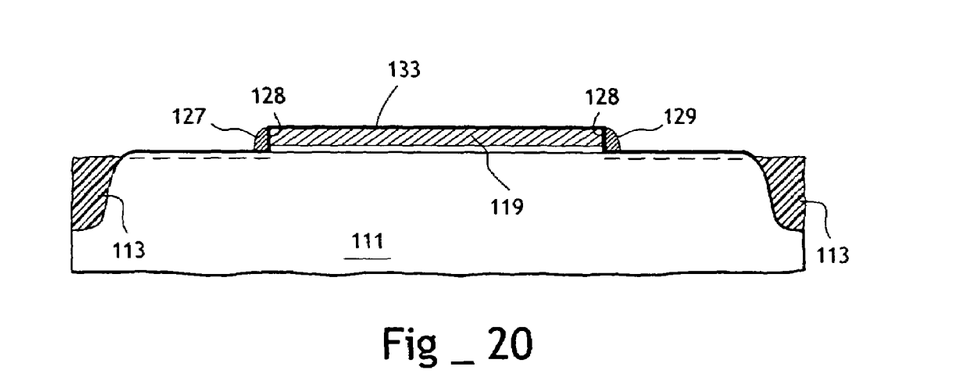

In FIG. 20, the poly layer 130 is seen to be etched back to the level of the thin layer of tunnel oxide, leaving a peripheral polysilicon belt around the polysilicon body 119, including what is seen to be a pair of polysilicon spacers 127 and 129 adjacent to opposed lateral sides of the polysilicon body 119. These spacers have the same shape and size as the spacers shown in FIG. 1 and will become part of the floating gate structures corresponding to floating spacers 27 and 29 in FIG. 1. Vertical tunnel oxide walls 128 separate poly spacers 127 and 129 from the mail polysilicon body 119 which is now completely surrounded by oxide. Tunnel oxide also extends beneath the spacers 127 and 129, separating the spacers from substrate 111.

Figure 21:
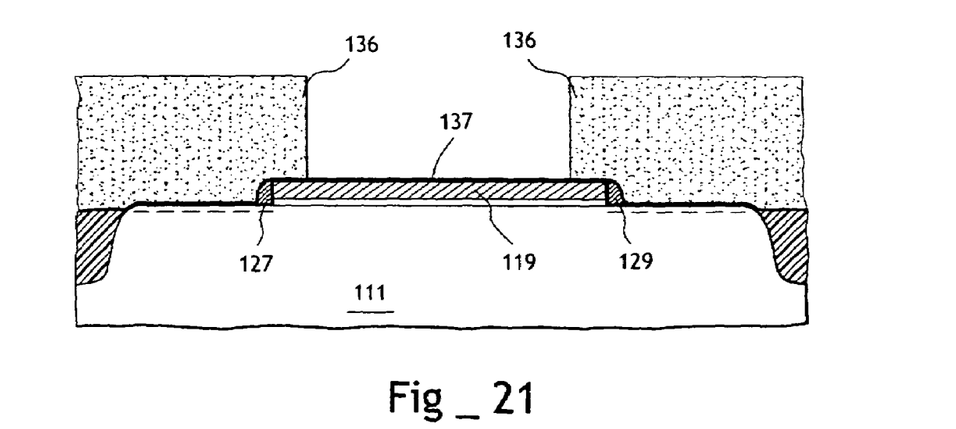

In FIG. 21, a layer of LTO oxide 137 is disposed over the structure shown in FIG. 20 in the region between the isolation regions 113. In order to trim the LTO layer over the central region of the polysilicon body 119, a resist mask 136 is applied with a central opening, but covering the spacers 127 and 129 and extending inwardly a small distance in the same manner as the mask 77 is used to trim the LTO oxide 67 in FIG. 13.

Figure 22:
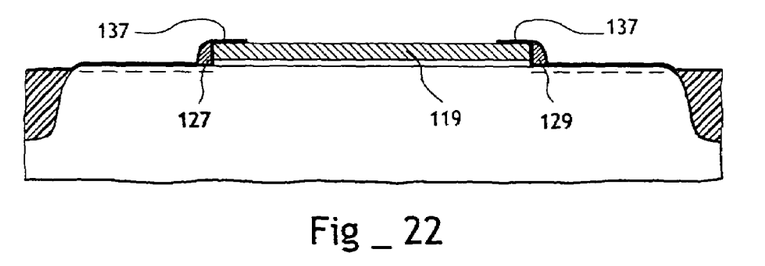
Figure 23:
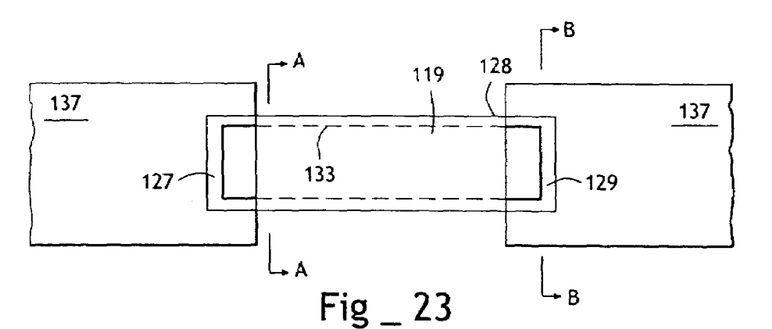
FIG. 23 is a top view of the structure shown in FIG. 22.

In FIG. 22, the LTO oxide 137 is seen to be divided into a left portion over poly spacer 127 and a right portion over poly spacer 129, with the polysilicon body 119 having an exposed region between these two LTO portions. In the top view of FIG. 23, the spacers 127 and 129 are seen to be part of a continuous polysilicon belt 128 surrounding the polysilicon body 119 but spaced therefrom by the thin tunnel oxide layer 133 seen as a dashed line surrounding polysilicon body 119.

Figure 23A:
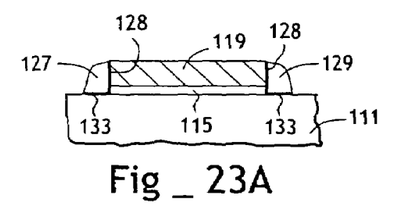
FIG. 23A is a transverse sectional view taken along lines A—A in FIG. 23.
Figure 23B:
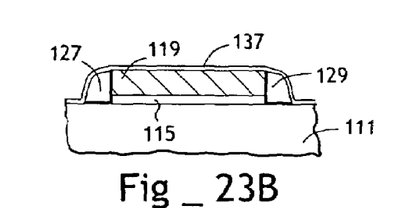
FIG. 23B is a transverse sectional view taken along lines B—B in FIG. 23.

Comparing the sections of FIGS. 23A and 23B, the main polysilicon body 119 is seen to be separated from polysilicon spacers 127 and 129 by the thin oxide layer 133, particularly vertical portions 128. The main body 119 is separated from substrate 111 by gate oxide 115. In FIG. 23B LTO oxide layer 137 is seen over the section of the structure seen in FIG. 23A. The LTO extends laterally outwardly, similar to FIG. 18.

Figure 17:
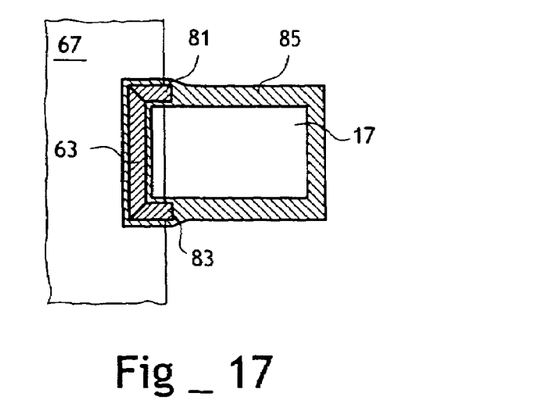
FIG. 17 is a top view of a portion of the structure illustrated in FIG. 16.
Figure 24:
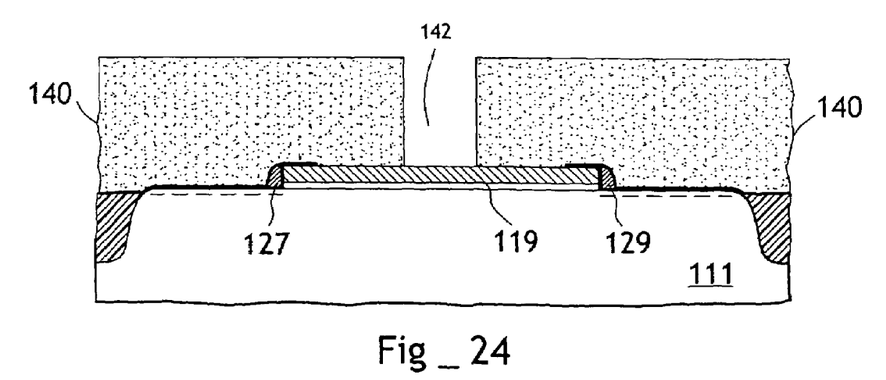
FIG. 24 is a side cutaway view of a further step in the manufacturing method shown in FIGS. 19–22.

FIG. 24 shows a resist mask 140 applied over the structure of FIG. 22. The mask has a central opening 142 for dividing the polysilicon body into two generally equal mesas, leaving a space between the two mesas. Once etching is applied, taking the central portion of the polysilicon body to the surface of substrate 111, an implant is made in the central region, as shown in FIG. 16 creating the doped region 45. Construction of the side-by-side memory cell transistors follows FIG. 16 with the growth of contacting poly 85, i.e. a third poly layer, surrounding each of the mesas, as seen in FIGS. 17 and 18. The contacting poly 85 assures that each mesa and its associated polysilicon spacer are at the same electrical potential, even though tunnel oxide separates the two. The two devices are finished by addition of an insulative ONO layer over the contacting poly and the floating gate poly, as well as the poly spacers. Another layer of poly, i.e. a fourth poly layer, over the insulative layer allows formation of control electrodes. Lastly the control electrodes are protected with insulator in the usual way.

This invention claimed is:

1. A semiconductor multi-bit, non-volatile memory structure comprising:
a pair of side-by-side floating gate memory cell devices fabricated in a common doped semiconductor substrate, one device to the left and one device to the right of a common central substrate region, each device having at least one sidewall spacer facing a central polysilicon body, insulated from the substrate, with left and right edges, the left device having a floating polysilicon spacer separated from the central polysilicon body on the left edge by tunnel oxide and the right device having a floating polysilicon spacer separated from the associated central polysilicon body on the right edge by tunnel oxide, each device having a substrate doped region forming an electrode outwardly adjacent to each polysilicon spacer and a shared electrode in the common central substrate region and each device having a polysilicon connector connecting the central polysilicon body electrically and the facing polysilicon spacer, the two memory cells capable of independently storing two binary bits of data in the form of charge transferred to and from the connected floating polysilicon spacers and the central polysilicon body, both at a common potential, under the influence of a control electrode atop the central polysilicon body, communicating charge to and from the substrate; and
wherein said polysilicon connector is a polysilicon layer associated with each memory cell contacting each polysilicon spacer and a portion of the central polysilicon body, electrically placing the spacer and polysilicon body at a common electrical potential.

2. The memory structure of claim 1 wherein a second polysilicon layer is the control electrode atop each polysilicon spacer and a portion of the facing central polysilicon body and separated therefrom by an oxide layer, wherein voltage signals applied to the second polysilicon layer cause electrical charge to tunnel into the underlying polysilicon spacer and facing polysilicon body from a doped substrate region.

3. The memory structure of claim 1 wherein the pair of side-by-side floating gate memory cell devices are disposed between opposed isolation regions.

4. The memory structure of claim 1 wherein the pair of side-by-side floating gate memory cell devices are symmetrically disposed about the common central substrate doped region.

5. The memory structure of claim 1 wherein the floating gate memory cell devices are programmed and erased in the manner of two separate and distinct electrically erasable programmable read only memory cells.

6. The memory structure of claim 5 wherein the floating gate memory cell devices are in a memory array.

7. A semiconductor multi-bit, non-volatile memory structure comprising:
at least one column of pairs of symmetric side-by-side floating gate memory cell devices fabricated in a common doped semiconductor substrate, each device having on one side of a plane of symmetry a central polysilicon body with an adjacent polysilicon spacer separated therefrom by tunnel oxide, with a first electrode in the substrate beneath the polysilicon spacer, a second electrode in the substrate disposed between and shared by the polysilicon bodies of the side-by-side devices and a third electrode insulated from and atop the polysilicon bodies, the central polysilicon body electrically joined to the adjacent polysilicon spacer, each device independently storing electrical charge by command of the third electrode communicating charge to and from the substrate and into the central polysilicon bodies and adjacent polysilicon spacers; and wherein said polysilicon connector is a polysilicon layer associated with each memory cell contacting each polysilicon spacer and a portion of the central polysilicon body, electrically placing the spacer and polysilicon body at a common electrical potential.

8. The memory structure of claim 7 wherein at least a portion of the tunnel oxide extends vertically between the central polysilicon body and the adjacent polysilicon spacer.

9. The memory structure of claim 7 wherein said side-by-side memory cell devices are orthogonal to the direction of said at least one column, thereby forming a memory array.

* * * * *